3,129,098

PROCESS FOR PREPARING PRINTING ELEMENTS

Robert Bernard Kitson, Philadelphia, Pa., assignor to E. I. du Pont de Nemours and Company, Wilmington, Del., a corporation of Delaware No Drawing. Filed Feb. 10, 1960, Ser. No. 7,748
8 Claims. (Cl. 96—35)

This invention relates to processes for preparing improved photopolymerized printing elements. More particularly it relates to processes for preparing photopolymerized printing elements using novel exposure and washout procedures.

Photopolymerizable elements useful for the preparation of printing reliefs are described in Plambeck U.S. Patents 2,760,863 and 2,791,504 and assignee's Martin et al. application, Serial No. 596,766, filed July 9, 1956, U.S. Patent 2,927,022, March 1, 1960. The printing reliefs are generally prepared by a single exposure through a process transparency followed by a washout step. Two actinic radiation sources useful for the exposure step include a broad radiation source such as a high pressure mercury arc and a carbon arc. The broad radiation source forms reliefs having continuously tapered sides. If any dust or dirt is present between the element and the negative, however, such a radiation source causes shallow image reliefs to be formed in the dust areas. The use of a carbon arc reduces the taper of the relief images and the effect of the dust or dirt. The geometry of the carbon arc, however, is such that small characters, e.g., periods and fine halftone highlight dots, are formed with insufficient support at their bases. The formation of small characters with insufficient base support is particularly true as the thickness of the photopolymerizable layer is increased, e.g., to a thickness of 30 mils and more. It has been found that if the exposure is continued until the small characters are insolubilized at the lower surface of the layer, the shadow areas become plugged and the recesses in some characters, e.g., the center of an "o" or an "e," may become filled. The result is that the printing relief has insufficient depth for a clear, sharp print.

An object of this invention is to provide processes for preparing improved photopolymerized printing elements. A further object is to provide such processes which are simple, quick and utilize standard equipment useful for the preparation of photopolymerized printing reliefs. Another object is to provide a process for preparing photopolymerized elements having printing reliefs wherein the base angles of the upper part of the relief is greater than the base angles of the lower portion of the relief and the major base of the lower portion of the relief is greater than that of the upper portion. A further object is to provide a process for preparing photopolymerized elements which can be used to make halftone and line images simultaneously. A still further object is to provide a process for preparing photopolymerized elements wherein the shadow relief in halftones is increased in depth. Still further objects will be apparent from the following description of the invention.

The process of this invention for preparing printing reliefs by exposing to actinic radiation a photopolymerizable element having a photopolymerizable layer 3 to 250 mils in thickness comprising (1) a preformed compatible macromolecular polymer binding agent, (2) a non-gaseous, addition-polymerizable ethylenically unsaturated compound containing at least one terminal ethylenic group capable of forming a high polymer by photoinitiated addition polymerization in the presence of an addition polymerization initiator therefor activatable by actinic light, and (3) from 0.0001 to 10% or more, by weight, of the layer of such an initiator, through an image-bearing transparency is characterized by (*a*) exposing said element for ⅛ to ½ the time required for essentially complete addition polymerization in the relief height-forming stratum of said layer, (*b*) washing the unexposed areas of said stratum with a solvent for said binder for 1/30 to ½ the time required for essentially complete removal of the unexposed portion of said stratum, (*c*) placing the transparency in register with the relief image, (*d*) exposing the resulting element to actinic light until polymerization is essentially complete in the exposed areas without polymerization in unexposed areas, and (*e*) washing the exposed element with an aforesaid solvent to remove the unexposed portion of said stratum.

In carrying out the process, it is desirable to have the image bearing transparency, e.g., line, halftone or combined line and halftone negative or stencil, in close proximity to the surface of the photopolymerizable element. Thus, it may be in contact with the photopolymerizable surface of the element or separated therefrom by a thin parting membrane, layer or film as described in Plambeck U.S. Patent 2,760,863 and below during the exposure of step (*a*) and similarly with the surface of the relief during step (*d*). After washing step (*b*), the surface of the relief should be dry and clean.

In a preferred embodiment of this invention, a translucent or transparent sheet is placed between the dried surface of the partially polymerized element and the registered image-bearing transparency, and the partially photopolymerized layer is exposed to actinic radiation until complete polymerization of the exposed image areas occurs. The upper portion of the relief characters obtained after washout is essentially perpendicular (straight). By using the insert sheet, however, the angle of the radiation of the second exposure is altered and the lower portion of the printing relief characters is tapered at an angle less than the upper portion. It is particularly preferred that the insert sheet be translucent, e.g., polyvinyl chloride/acetate, polyethylene terephthalate overcoated with a gelatin-starch emulsion, cellulose acetate, polyethylene, polyvinyl fluoride, or other sheets naturally translucent or made translucent during manufacture.

In still another embodiment, the insert sheet is omitted, but the light source used for the second exposure is varied to give the tapered base effect. After registering the image-bearing transparency, the partially photopolymerized surface is exposed by a point source above its center, then above the four sides, the radiation source, i.e., a point source such as a carbon arc, being maintained at an angle from 10° to 85° between the radiation source and the photopolymerizable surface. The unexposed areas are then completely removed, as previously described, to yield the desired relief printing characters.

The photopolymerizable layer, 3 to 250 mils in thickness, useful in this invention is formed from a photopolymerizable composition which comprises:

(1) An organic polymeric binder, 40 to 90 parts by weight, (2) An ethylenically unsaturated compound containing 1 to 4 terminal ethylenic groups, having a boiling point above 100° C. at normal atmospheric pressure, a molecular weight of less than 1500 and being capable of forming a high polymer by photoinitiated addition polymerization, 10 to 60 parts by weight, and (3) An addition polymerization initiator inactive thermally below 85° C., 0.0001 to 10.0 parts by weight.

In addition to the above constituents, the photopolymerizable layer can contain, if desired, (4) A thermal polymerization inhibitor, 0.001 to 6.0 parts by weight.

The instant invention is not limited to the particular photopolymerizable composition of the examples. Suitable compositions which can be used are described in Plambeck U.S. Patents 2,760,863 and 2,791,504. Other photopolymerizable compositions which can be used are described in the patents and U.S. applications of assignee as follows:

(1) N-methoxymethyl polyhexamethylene adipamide mixtures of Saner, Ser. No. 577,829, filed April 12, 1956, abandoned May 4, 1962;
(2) Linear polyamide compositions containing extralinear N-acrylyloxymethyl groups of Saner et al., Ser. No. 753,344, filed August 5, 1958, U.S. Patent 2,972,540, February 21, 1961;
(3) Polyvinyl acetal compositions having the extralinear vinylidene groups of Martin, Ser. No. 461,291, filed October 8, 1954, U.S. Patent 2,929,710, March 22, 1960, and corresponding British Patent 786,119;
(4) Polyester, polyacetal or mixed polyester acetal mixtures of Martin U.S. Patent 2,893,716;
(5) Blends of selected organic-soluble, base-soluble cellulose derivatives with addition-polymerizable components and photoinitiators of Martin et al., Ser. No. 596,766, filed July 9, 1956, U.S. Patent 2,927,022, March 1, 1960;
(6) Polyvinyl alcohol derivatives of Martin U.S. Patent 2,902,365;
(7) 1,3-butadiene compositions of McGraw Ser. No. 664,459, filed June 10, 1957, and continuation-in-part Ser. No. 833,928, filed August 17, 1959, U.S. Patent 3,024,180, March 6, 1962.

In addition, the following photopolymerizable composition can be used: cellulose acetate (60 parts by weight), triethylene glycol diacrylate (40 parts by weight), anthraquinone (0.1 part by weight), and p-methoxyphenol (0.1 part by weight).

This invention will be further illustrated by, but is not intended to be limited to the following examples.

*Example I*

A photopolymerizable element having a polymerizable layer thickness of 40 mils was prepared as described in Example 3 of assignee's Burg application, Serial No. 750,868, filed July 25, 1958, U.S. Patent 3,036,913, May 29, 1962. A line process photographic negative was placed on the photopolymerizable element, and the system was placed in a vacuum frame. The photopolymerizable layer was exposed for 3 minutes to the radiation of a 6,000-watt carbon arc supported 30 inches from the element. The element was removed from the vacuum frame, was washed for one minute with an 0.04 N aqueous solution of NaOH, was rinsed with water and was allowed to dry. A relief approximately 15 mils in thickness formed on the photopolymerizable layer. The line process negative was registered on the image and the system was placed once more in the vacuum frame. The image surface was exposed for one minute through its top surface by means of the carbon arc described above in this example. The radiation source was then used to expose the partially photopolymerizable layer of the element for one minute from each of four directions at an angle of 45° between the carbon arc and the vacuum frame. The element was removed from the vacuum frame and the unpolymerized areas of the photopolymerizable layer were removed by washing with an 0.04 N aqueous solution of NaOH until a 40-mil relief was obtained. The printing relief obtained had an upper portion 15 mils in thickness, the sides of the upper portion being straight, while the lower portion of the printing relief had tapered sides. The printing element was used for printing in a flat bed press, highly satisfactory printed impressions over a lengthy press run being obtained.

*Example II*

A photopolymerizable layer, 40 mils in thickness, was prepared by placing a mixture consisting of 345 g. of cellulose acetate succinate, 167 g. of triethylene glycol diacrylate containing 0.17 g. of anthraquinone, 0.17 g. of p-methoxyphenol and 0.17 g. of mucochloric acid and 10 g. of triethylamine on a rubber mill preheated to 105° C., milling for 22 minutes and pressing in a hydraulic press, the platens of which were heated to 170° C. The photopolymerizable layer was then bonded to an aluminum base support as described in Example 5 of assignee's Burg application, Serial No. 750,868, filed July 25, 1958. The photopolymerizable element was placed in a vacuum frame, and a line process photographic negative was placed over the photopolymerizable surface. The vacuum frame cover sheet consisting of a thin layer of calendered, translucent polyvinyl chloride/acetate sheeting was placed over the system and the vacuum drawn. The vacuum frame was then positioned in a vertical position and the carbon arc described in Example I was located 30 inches from the element surface. The photopolymerizable surface was exposed for 3 minutes; the element was removed from the vacuum frame and was spray washed for 1 minute with an 0.04 N aqueous solution of NaOH at 24° C. The element was allowed to dry before the negative was registered to the relief image. Vacuum was again applied, and the partially photopolymerized layer of the element was exposed a second time as described above but for 5 minutes. The carbon arc was maintained in the same position as during the first exposure. After removal from the vacuum frame, the element was washed for 7.0 minutes in the NaOH solution described above in this example to remove all the remaining unexposed polymer. Printing relief characters were obtained which had an upper portion, 5 mils in thickness having essentially perpendicular sides and a lower portion tapered at an angle of about 70 degrees. The printing element was used for printing, highly satisfactory results being obtained as described in Example I.

*Example III*

Example II was repeated except that after the partially photopolymerized layer of the element was dried a 4-mil thick sheet of polyethylene terephthalate film was placed on the partially photopolymerized surface and the negative was placed on the polyethylene terephthalate sheet and was registered to the relief image. The assembly was placed in a vacuum frame, the partially photopolymerized layer was exposed and the unpolymerized material removed as described in Example II. A relief printing element was obtained in which the upper portion of the relief characters, 5 mils in depth, had sides which were essentially perpendicular (straight) and a lower portion whose sides were tapered at an angle of about 65 degrees. The printing element was used for printing in a flat bed press, highly satisfactory results being obtained.

*Example IV*

Example II was again repeated except that after the partially photopolymerized layer of the element was dried a 4-mil thick sheet of polyethylene terephthalate film bearing a subcoat of a copolymer of vinylidene chloride/methyl acrylate/itaconic acid as disclosed in assignee's Alles et al. U.S. Patent 2,627,088 and being overcoated on both sides with an emulsion layer containing gelatin and rice starch was placed on the element surface. A photographic negative was placed on the cover sheet and was registered to the relief image. After the assembly was placed in the vacuum frame, the partially photopolymerized layer was exposed and the unpolymerized material removed as described in Example II. Results similar to Example II were obtained except that the taper of the lower portion of the printing relief characters was about 60 degrees.

*Example V*

The photopolymerizable element described in Example II was placed in a vacuum frame and a line process photographic negative was placed over the photopolymerizable surface. The vacuum was drawn and the photopolymerizable surface was exposed for 1.5 minutes to the radiation of a 1,800-watt high pressure, mercury-arc radiation source located 2 inches from the element surface. The element was removed from the vacuum frame, and the surface was spray-washed for 1.0 minute with an 0.04 N aqueous solution of NaOH at 24° C. and was dried. A 5-mil relief was obtained. The negative was registered on the element surface and vacuum was drawn. The surface was exposed as described, i.e., by a scanning radiation source for 2.5 minutes. After exposure, the exposed surface was spray washed for 7 minutes with the NaOH solution described above in this example, a 40-mil relief image being obtained. The sides of the top 5-mil portion were essentially perpendicular to the base; the sides of the lower portion had a base angle of about 60°.

Photopolymerizable compositions useful in this invention are described in the patents and applications listed above. These compositions comprise addition-polymerizable ethylenically unsaturated compounds, addition-polymerization initiators and, if desired, thermal, addition polymerization inhibitors.

Suitable addition-polymerizable ethylenically unsaturated compounds, in addition to the preferred triethylene glycol diacrylate and polyethylene glycol diacrylates with an average molecular weight of the diol precursor of 200 to 600, include vinylidene monomers, particularly the vinyl monomers described in Plambeck U.S. Patent 2,791,-504, col. 17, line 62, to col. 18, line 16, acrylic or methacrylic acid esters of diethylene glycol, triethylene glycol and higher polyalkylene glycols, e.g., methoxytriethylene glycol acrylate, ethylene glycol dimethacrylate, diethylene glycol diacrylate, methoxytriethylene glycol methacrylate, di- and triethylene glycol acrylates, and methacrylates, the acrylates, diacrylates, methacrylates and dimethacrylates of tetraethylene glycol, dipropylene glycol, and polybutylene glycols. Still other useful compounds include the diacrylates and dimethacrylates of ether-glycols which also contain a combined intrachain dibasic acid unit, e.g., the diacrylate or dimethacrylate of $$HOCH_2CH_2OCH_2CH_2O\text{—}OCRCOOCH_2CH_2OCH_2CH_2OH$$

where R is a divalent hydrocarbon radical, e.g., methylene or ethylene. Other useful vinyl monomers include glycerol triacrylate, 1,2,4-butanetriol trimethacrylate and pentaerythritol tetramethacrylate.

An addition polymerization initiator activatable by actinic radiation and which is inactive thermally below 85° C. is added in amount of from 0.0001 to 10 parts by weight, preferably 0.001 to 0.2 part by weight. Examples of initiators inactive thermally at 85° C. and below are vicinal ketaldonyl compounds such as diacetyl, benzil, etc., α-ketaldonyl alcohols such as benzoin, pivaloin, etc., acyloin ethers such as benzoin methyl or ethyl ethers, alphahydrocarbon substituted aromatic acyloins including α-methylbenzoin, α-allylbenzoin and α-phenylbenzoin. In addition, o-alkyl xanthate esters (U.S. 2,716,633) are useful. Preferably, however, the photoinitiators are thermally inactive below 185° C. The anthraquinone photoinitiators fall within this range. In addition to anthraquinone other suitable initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 1,2-benzanthraquinone, 2-3-benzanthraquinone, 2-methyl - 1,4 - naphthoquinone, 2,3 - dichloronaphthoquinone, 1,4-dimethylanthraquinone, 2,3-dimethylanthraquinone, 2 - phenylanthraquinone, 2,3 - diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

A thermal addition polymerization inhibitor is present in the preferred composition. Suitable thermal polymerization inhibitors that can be used in addition to the preferred p-methoxyphenol include hydroquinone and alkyl and aryl-substituted hydroquinones, tert-butyl catechol, pyrogalol, copper resinate, naphthylamines, betanaphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., Thionine Blue G (C.I. 52025), Methylene Blue B (C.I. 52015) and Toluidine Blue O (C.I. 52040).

The above-described photopolymerizable compositions are used to prepare photopolymerizable printing elements comprising an adherent support having superposed thereon a solid layer of the photopolymerizable composition from 3 to 250 mils in thickness. The thickness of the photopolymerizable layers vary according to the use. Thickness ranges are disclosed in Plambeck U.S. Patent 2,791,504, col. 3, lines 17 to 25.

The base or support for the photopolymerizable elements of this invention are preferably flexible and composed of metal, e.g., aluminum or steel, but they can be rigid. They also can be made of various film-forming resins or polymers. Suitable supports are disclosed in U.S. Patent 2,760,863, col. 5, lines 14 to 33. Various anchor layers, as disclosed in this patent, may be used to give strong adherence between the base and the photopolymerizable layer. The adhesive compositions disclosed in assignee's U.S. application of Burg, Serial No. 750,868, filed July 25, 1958, are also very effective.

An antihalation material can be present in the support, or in a layer or stratum on the surface of the support, or can be contained in the anchor layer. With transparent or translucent supports, the antihalation material may be on the rear surface of the element. When antihalation material is used it preferably should be sufficiently absorptive of actinic light to permit reflectance from the support or combined support of no more than 35% of incident actinic light.

To form the relief printing element, the photopolymerizable printing element is exposed to actininc radiation through a process transparency, e.g., a process negative or positive (an image-bearing transparency consisting solely of substantially opaque and substantially transparent areas where the opaque areas are substantially of the same optical density, the so-called line or halftone negative or positive).

The initial exposure, as illustrated by the examples, is a partial exposure. During this initial exposure the upper portion of the relief printing characters is formed. The time of exposure varies with the particular photopolymerizable composition used, with the character depth required and the distance of the actinic radiation source from the element surface. The initial exposure time ranges from 12.5 to 50 percent of the time required for complete exposure of the photopolymerizable layer. Preferably the initial exposure amounts to 37.5 percent of the exposure required for complete polymerization. Generally an exposure of 120 to 240 seconds is satisfactory for a photopolymerizable layer 40 mils in thickness using the carbon arc source of the examples.

The initial exposure can be accomplished by using a point or a broad actinic radiation source. The radiation source should furnish an effective amount of ultraviolet radiation since free-radical-generating addition-polymerization initiators activatable by actinic radiation generally exhibit their maximum sensitivity in this range. Suitable sources include carbon arcs, mercury-vapor arcs, fluorescent lamps with special ultraviolet-radiation-emitting phosphors, argon glow lamps, and photographic flood lamps. The point source carbon arc is preferred. The point radiation sources are generally used at a distance of 20 up to about 40 inches from the photopolymerizable element. Broad radiation sources can be used at a distance up to 24 inches from the photopolymerizable surface. The distance may vary, however, depending on the strength of the radiation source and the time required for exposure.

After the initial removal of the unpolymerized areas of the photopolymerizable layer, the element is exposed to an actinic radiation source again. During this exposure the polymerization of the photopolymerizable layer is completed and the tapered base is formed. The above-described radiation sources are useful for the second or final exposure. The sources are generally maintained at the same distances used for the preliminary exposure. In the embodiment where the photopolymerizable element is exposed from each of its sides, however, a point radiation source is preferred. The final exposure time is at least fifty percent of the time required for complete exposure of the photopolymerizable layer, preferably 62.5 percent. Generally an exposure of 225 to 600 seconds with the carbon arc is satisfactory for a photopolymerizable layer 40 mils thick.

After each exposure step, the unexposed areas of the photopolymerizable layer are removed by means of an aqueous solution. Suitable aqueous solutions for the preferred photopolymerizable composition comprising cellulose acetate succinate as the organic polymeric binder include preferably alkali metal hydroxides, e.g., sodium and potassium, and in addition, ammonium, ammonium-substituted hydroxides and the basic reacting salts of the alkali metal hydroxides, especially those of weak acids, e.g., the carbonates, bicarbonates and acetates. Generally the base will be present in concentrations ranging from about 0.01 to about 10 percent, although normally solutions greater than about 5 percent will not be used. The washout solution may be applied in any conventional manner, as by pouring, immersing and brushing or spraying in removing the unpolymerized areas. Suitable solvents for the other photopolymerizable compositions which are useful in the present invention can be found in their respective patents or applications.

The initial washout removes unexposed areas of the photopolymerizable layer corresponding to the upper portion of the layer (where the sides are essentially perpendicular to the base). Preferably the initial washout time is about 12.5 percent of the time required for the complete washout of the photopolymerizable element, but it can range from 3 to 50 percent of the total washout time. Generally for an element having a photopolymerizable layer thickness of 30 to 40 mils, the washout time is 45 to 80 seconds. The final washout time does not have to be controlled as critically as the initial washout period. In general for a photopolymerizable layer 30 to 40 mils thick, 300 to 500 seconds for the final washout are sufficient.

In the preferred embodiment, after the initial exposure, initial washout and the element is dried, preferably a translucent film sheet is placed between the dried surface of the element and the process transparency. Suitable translucent sheets which are naturally translucent or are made translucent during manufacture include polymers of polyvinyl chloride/acetate, polyethylene terephthalate having an overcoating of a gelatin-rice starch or silica emulsion, polyethylene terephthalate containing silica, polyvinyl fluoride, cellulose acetate, polyethylene, etc. The above polymeric films in transparent form give satisfactory results. Additional transparent films include polyethylene terephthalate, cellulose triacetate, cellulose, nitrate, polystyrene, vinylidene chloride copolymers, e.g., vinyl chloride, acrylonitrile, acrylates; acrylates, etc. The use of the preferred translucent film causes diffusion of the actinic radiation and results in the sides of the lower portion of the photopolymerizable layer being tapered. By using the transparent sheeting, the sides of the lower portion of the photopolymerizable layer also become tapered but the taper is generally not as great as when translucent sheeting is used. The angle of the characters in the lower portion of the photopolymerizable layer varies with the cover sheet, the geometry of the radiation source, the photopolymerizable layer composition and thickness.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing and ordinary letterpress printing, the latter requiring greater height differences between printing and non-printing areas and those wherein the ink is carried by the recessed portions of the relief such as in intaglio printing, e.g., line and inverted halftone. The plates are useful for multicolor printing.

An advantage of this invention is that it provides a simple and dependable means for controlling the shape of the printing characters. By using the translucent or transparent insert sheet prior to the final exposure the desired character form takes place automatically without technical control being required.

A further advantage is that the printing characters obtained according to the invention exhibit long press life, because, as the printing characters wear, there is little adverse effect on the quality of the print obtained, inasmuch as the sides of the upper portions of the characters are essentially perpendicular to the base.

Another advantage is that there is little collection of printing ink and paper dust or debris in the relief during printing.

Still other advantages are that the printing characters are more strongly attached to the base support because the lower portion of the printing character has a larger base area. The relief characters are improved because the characters including the small characters are formed during the initial exposure, and the tapered lower portion is formed during the final exposure. This results in no over exposure and plugging of images in text and reverse areas or insufficient formation of the character support.

Further advantages will be apparent to those skilled in the art from the foregoing description.

I claim:

1. A process for preparing printing reliefs by exposing to actinic radiation a photopolymerizable element having a solid photopolymerizable layer from 3 to 250 mils in thickness comprising (1) a preformed compatible macromolecular polymer binding agent, (2) a non-gaseous, addition-polymerizable ethylenically unsaturated compound containing at least one terminal ethylenic group capable of forming a high polymer by photoinitiated addition polymerization in the presence of an addition polymerization initiator therefor activatable by actinic light, and (3) from 0.0001 to 10%, by weight, of the layer of such an initiator, through an image-bearing transparency, characterized by (*a*) exposing said element to said radiation for ⅛ to ½ the time required for essentially complete addition polymerization in the relief height-forming stratum of said layer, (*b*) washing the unexposed areas of said stratum with a solvent for said binder for 1/30 to ½ the time required for essentially complete removal of the unexposed portion of said stratum, (*c*) placing the transparency in register with the relief image, (*d*) exposing the resulting element to actinic light until polymerization is essentially complete in the exposed areas without polymerization in unexposed areas, and (*e*) washing the exposed element with an aforesaid solvent to remove the unexposed portion of said stratum.

2. A process as set forth in claim 1 wherein antihalation material is present beneath the photopolymerizable layer.

3. A process as set forth in claim 1 wherein said initiator is thermally inactive below 85° C.

4. A process as set forth in claim 1 wherein said initiator is inactive thermally below 185° C.

5. A process as set forth in claim 1 wherein a dilute aqueous solution of sodium hydroxide is used as the solvent.

6. A process as set forth in claim 1 wherein the relief is dried after step (*b*) and a transparent parting membrane is placed on the dried relief.

7. A process as set forth in claim 1 wherein the relief is dried after step (*b*) and a translucent parting membrane is placed on the dried relief.

8. A process as set forth in claim 1 wherein step (*a*) is carried out with the source of actinic radiation directly above the element and step (*d*) is carried out with the source of radiation at an angle of 10° to 85° from the surface of said element and from each of a plurality of directions.

References Cited in the file of this patent

UNITED STATES PATENTS

| | | |
|---|---|---|
| 2,927,022 | Martin et al. | Mar. 1, 1960 |
| 2,927,023 | Martin | Mar. 1, 1960 |
| 2,964,401 | Plambeck | Dec. 13, 1960 |
| 2,997,391 | Murray et al. | Aug. 22, 1961 |
| 3,024,180 | McGraw | Mar. 6, 1962 |

FOREIGN PATENTS

| | | |
|---|---|---|
| 8,043 of 1892 | Great Britain | Apr. 22, 1893 |